(12) United States Patent
Jin et al.

(10) Patent No.: US 9,601,561 B2
(45) Date of Patent: Mar. 21, 2017

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventors: Guang Hai Jin, Seoul (KR); Yong Joo Kim, Cheonan-si (KR); Min Hyeng Lee, Cheonan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/925,061

(22) Filed: Oct. 28, 2015

(65) Prior Publication Data
US 2016/0148989 A1    May 26, 2016

(30) Foreign Application Priority Data
Nov. 20, 2014    (KR) ........................ 10-2014-0162431

(51) Int. Cl.
| | |
|---|---|
| *H01L 27/15* | (2006.01) |
| *H01L 31/12* | (2006.01) |
| *H01L 33/00* | (2010.01) |
| *H01L 27/32* | (2006.01) |

(52) U.S. Cl.
CPC ...... *H01L 27/3276* (2013.01); *H01L 27/3262* (2013.01); *H01L 27/3265* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

2003/0127651 A1* 7/2003 Murakami .......... H01L 27/3248
                                                          257/72

FOREIGN PATENT DOCUMENTS

| KR | 10-2010-0049385 A | 5/2010 |
|---|---|---|
| KR | 10-2012-0069457 A | 6/2012 |
| KR | 10-2013-0107459 A | 10/2013 |
| KR | 10-2014-0018623 A | 2/2014 |

* cited by examiner

*Primary Examiner* — Hoai V Pham
(74) *Attorney, Agent, or Firm* — Lee & Morse P.C.

(57) ABSTRACT

An organic light emitting diode display device includes a semiconductor on a substrate with a driving channel, an auxiliary storage electrode on the substrate with a storage electrode formed of a same material as the semiconductor and separated therefrom, a first insulating layer covering the semiconductor and the auxiliary storage electrode, a driving gate electrode overlapping the auxiliary storage electrode to define an auxiliary storage capacitor, a second insulating layer covering the driving gate electrode and the first insulating layer, a main storage electrode overlapping the driving gate electrode to define a main storage capacitor, a passivation layer covering the data wire and the second insulating layer, a pixel electrode on the passivation layer, an organic emission layer on the pixel electrode, and a common electrode on the organic emission layer.

17 Claims, 8 Drawing Sheets

ORGANIC LIGHT EMITTING DIODE DISPLAY DEVICE

CROSS-REFERENCE TO RELATED APPLICATION

Korean Patent Application No. 10-2014-0162431, filed on Nov. 20, 2014, in the Korean Intellectual Property Office, and entitled: "Organic Light Emitting Diode Display Device," is incorporated by reference herein in its entirety.

BACKGROUND

1. Field

The present disclosure relates to an organic light emitting diode display device.

2. Description of the Related Art

An organic light emitting diode display device includes two electrodes and an organic emission layer positioned therebetween. An electron injected from one electrode and a hole injected from the other electrode are coupled with each other in the organic emission layer to generate an exciton, and the exciton emits energy to emit light.

Such an organic light emitting diode display device includes a plurality of pixels with organic light emitting diodes, which are self-emission devices. In each pixel, a plurality of transistors for driving the organic light emitting diode and at least one storage capacitor are formed. The plurality of thin film transistors may include a switching thin film transistor and a driving thin film transistor. The capacitor is formed of two electrodes and an insulating layer disposed therebetween, and areas of the two electrodes may be increased by a thickness of the insulating layer.

SUMMARY

An exemplary embodiment provides an organic light emitting diode display device, including an insulation substrate, a semiconductor disposed on the insulation substrate and including a driving channel, an auxiliary storage electrode on the insulation substrate, the auxiliary storage electrode being formed of a same material as that of the semiconductor and being separated from the semiconductor, a first insulating layer covering the semiconductor and the auxiliary storage electrode, a gate wire on the first insulating layer, the gate wire including a driving gate electrode overlapping the driving channel of the semiconductor and the auxiliary storage electrode, the auxiliary storage electrode with the driving gate electrode defining an auxiliary storage capacitor, a second insulating layer covering the gate wire and the first insulating layer, a data wire on the second insulating layer, the data wire including a vertical driving voltage line and a main storage electrode, and the main storage electrode overlapping the driving gate electrode of the gate wire to define a main storage capacitor, a passivation layer covering the data wire and the second insulating layer, a pixel electrode on the passivation layer, an organic emission layer on the pixel electrode, and a common electrode disposed on the organic emission layer.

The auxiliary storage electrode and the main storage electrode may be electrically connected to each other through a contact hole formed in the first insulating layer and the second insulating layer.

The auxiliary storage electrode may be disposed at opposite sides of the driving channel.

The main storage electrode may be an expanded portion of the vertical driving voltage line.

The semiconductor may further include a switching channel, a first compensation channel, a second compensation channel, a first initialization channel, a second initialization channel, an operation control channel, a light emission control channel, and a bypass channel, and the switching channel, the first compensation channel, the second compensation channel, the first initialization channel, the second initialization channel, the operation control channel, the light emission control channel, and the bypass channel may be integrally formed with the driving channel.

The semiconductor may further include: a driving source electrode and a driving drain electrode respectively disposed at opposite sides of the driving channel; a switching source electrode and a switching drain electrode respectively disposed at opposite sides of the switching channel; a first compensation source electrode and a first compensation drain electrode respectively disposed at opposite sides of the first compensation channel; a second compensation source electrode and a second compensation drain electrode respectively disposed at opposite sides of the second compensation channel; a first initialization source electrode and a first initialization drain electrode respectively disposed at opposite sides of the first initialization channel; a second initialization source electrode and a second initialization drain electrode respectively disposed at opposite sides of the second initialization channel; an operation control source electrode and an operation control drain electrode respectively disposed at opposite sides of the operation control channel; a light emission control source electrode and a light emission control drain electrode respectively disposed at opposite sides of the light emission control channel; and a bypass source electrode and a bypass drain electrode respectively disposed at opposite sides of the bypass channel.

The gate wire may further include: a scan line configured to transfer a scan signal; a previous scan line configured to transfer a previous scan signal; a light emission control line configured to transfer a light emission control signal; a bypass control line configured to transfer a bypass signal; and a horizontal driving voltage line connected to the vertical driving voltage line.

The scan line, the previous scan line, the light emission control line, the bypass control line, and the horizontal driving voltage line may be disposed to extend in a same direction.

The scan line may include a switching gate electrode configured to overlap the switching channel, a first compensation gate electrode configured to overlap the first compensation channel, and a second compensation gate electrode configured to overlap the second compensation channel, the previous scan line may include a first initialization gate electrode configured to overlap the first initialization channel and a second initialization gate electrode configured to overlap the second initialization channel, the light emission control line may include an operation control gate electrode configured to overlap the operation control channel and a light emission control gate electrode configured to overlap the light emission control channel, and the bypass control line may include a bypass gate electrode configured to overlap the bypass channel.

The data wire may include: a data line connected to the switching source electrode; a first data connecting member connected to the driving source electrode, the second compensation drain electrode and the second initialization drain electrode; a second data connecting member connected to the first initialization source electrode, and the bypass drain electrode; and a third data connecting member connected to the operation control drain electrode and the pixel electrode.

The data line may be disposed to cross the scan line and transfer a data signal, and the vertical driving voltage line may be disposed to extend in a direction that is parallel with the data line and transfer a driving voltage.

The organic light emitting diode display device may further include an initialization line disposed on the passivation layer and connected to the second data connecting member.

The initialization line may be formed of a same material as that of the pixel electrode to transfer an initialization voltage.

The driving source electrode may be connected to the switching drain electrode and the operation control drain electrode, and the driving drain electrode may be connected to the first compensation source electrode and the light emission control source electrode.

The first compensation source electrode may be connected to the light emission control source electrode and the driving drain electrode, and the first compensation drain electrode may be connected to the second compensation source electrode.

The first initialization drain electrode may be connected to the second initialization source electrode.

The operation control electrode may be connected to the vertical driving voltage line.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, but does not essentially mean positioning on the upper side of the object portion based on a gravity direction.

Further, in the specification, the phrase "in a plan view" means when an object portion is viewed from above, and the phrase "in a cross-section" means when a cross-section taken by vertically cutting an object portion is viewed from the side.

Figure 1:
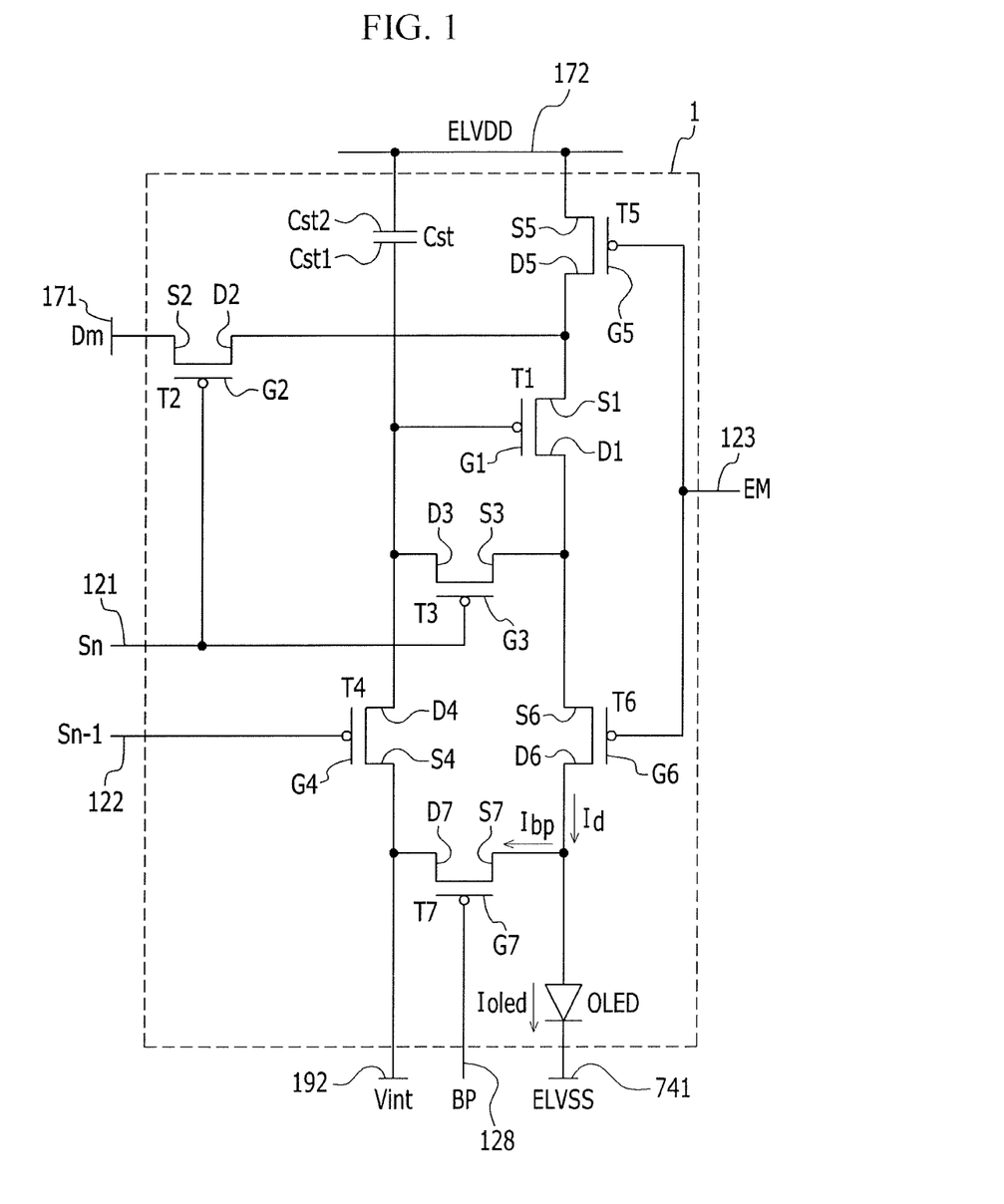
FIG. 1 illustrates an equivalent circuit diagram of one pixel of an organic light emitting diode display device according to an exemplary embodiment.

FIG. 1 is an equivalent circuit diagram of one pixel of an organic light emitting diode display device according to an exemplary embodiment.

As illustrated in FIG. 1, one pixel 1 of an organic light emitting diode display device according to an exemplary embodiment may include a plurality of signal lines 121, 122, 123, 128, 171, 172, and 192, a plurality of transistors T1, T2, T3, T4, T5, 16, and T7 connected to the plurality of signal lines, a storage capacitor Cst, and an organic light emitting diode OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7. The signal lines 121, 122, 123, 128, 171, 172, and 192 include a scan line 121 transferring a scan signal Sn, a previous scan line 122 transferring a previous scan signal Sn−1 to the initialization transistor T4, a light emission control line 123 transferring a light emission control signal EM to the operation control transistor T5 and the light emission control transistor T6, a bypass control line 128 transferring a bypass signal BP to the bypass transistor T7, a data line 171 crossing the scan line 121 and transferring a data signal Dm, a driving voltage line 172 transferring a driving voltage ELVDD and formed to be substantially parallel with the data line 171, and an initialization voltage line 192 transferring an initialization voltage Vint initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode OLED via the light emission control transistor T6. The driving transistor T1 receives the data signal Dm according to a switching operation of the switching transistor T2 to supply a driving current Id to the organic light emitting diode OLED.

A gate electrode G2 of the switching transistor T2 is connected with the scan line 121, a source electrode S2 of the switching transistor T2 is connected with the data line 171, and a drain electrode D2 of the switching transistor T2 is connected with the source electrode Si of the driving transistor T1 and connected with the driving voltage line 172 via the operation control transistor T5. The switching transistor T2 is turned on according to the scan signal Sn received through the scan line 121 to perform a switching operation of transferring the data signal Dm transferred to the data line 171 to the source electrode of the driving transistor T1.

A gate electrode G3 of the compensation transistor T3 is connected with the scan line 121, a source electrode S3 of the compensation transistor T3 is connected with the drain electrode D1 of the driving transistor T1 and connected with an anode of the organic light emitting diode OLED via the light emission control transistor T6, and a drain electrode D3 of the compensation transistor T3 is connected with the drain electrode D4 of the initialization transistor T4, one end Cst1 of the storage capacitor Cst, and the gate electrode G1 of the driving transistor T1 together. The compensation transistor T3 is turned on according to the scan signal Sn received through the scan line 121 to connect the gate electrode G1 and the drain electrode D1 of the driving transistor T1 and diode-connect the driving transistor T1.

A gate electrode G4 of the initialization transistor T4 is connected with the previous scan line 122, a source electrode S4 of the initialization transistor T4 is connected with the initialization voltage line 192, and a drain electrode D4 of the initialization transistor T4 is connected together with one end Cst1 of the storage capacitor Cst and the gate electrode G1 of the driving transistor T1 via the drain electrode D3 of the compensation transistor T3. The initialization transistor T4 is turned on according to the previous scan signal Sn−1 received through the previous scan line 122 to transfer the initialization voltage Vint to the gate electrode G1 of the driving transistor T1 and then perform an initialization operation of initializing a gate voltage of the gate electrode G1 of the driving transistor T1.

A gate electrode G5 of the operation control transistor T5 is connected with the light emission control line 123, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected with the light emission control line 123, a source electrode S6 of the light emission control transistor T6 is connected with the drain electrode D1 of the driving transistor T1 and the source electrode S3 of the compensation transistor T3, and a drain electrode D6 of the light emission control transistor T6 is electrically connected with an anode of the organic light emitting diode OLED. The operation control transistor T5 and the light emission control transistor T6 are simultaneously turned on according to the light emission control signal EM received through the light emission control line 123, and as a result, the driving voltage ELVDD is compensated through the diode-connected driving transistor T1 to be transferred to the organic light emitting diode OLED.

A gate electrode G7 of the bypass transistor T7 is connected with the bypass control line 128, a source electrode S7 of the bypass transistor T7 is connected together with the drain electrode D6 of the light emission control transistor T6 and the anode of the organic light emitting diode OLED, and a drain electrode D7 of the bypass transistor T7 is connected together with the initialization voltage line 192 and the source electrode S4 of the initialization transistor T4.

The other end Cst2 of the storage capacitor Cst is connected with the driving voltage line 172, and a cathode of the organic light emitting diode OLED is connected with a common voltage line 741 transferring a common voltage ELVSS.

Hereinafter, a detailed operation process of one pixel 1 of an organic light emitting diode display device according to an exemplary embodiment will be described in detail with reference to FIG. 2.

Figure 2:
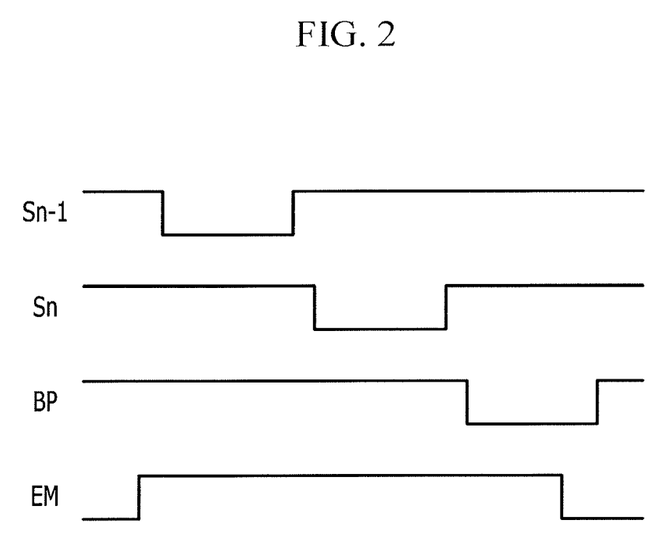
FIG. 2 illustrates a timing diagram of signals applied to one pixel of an organic light emitting diode display device according to an exemplary embodiment.

FIG. 2 is a timing diagram of signals applied to one pixel of an organic light emitting diode display device according to an exemplary embodiment.

Referring to FIGS. 1-2, the previous scan signal Sn−1 at a low level is firstly supplied through the previous scan line 122 for an initialization period. In this case, the light emission control signal EM at a low level is already applied through the light emission control line 123. Then, the initialization transistor T4 is turned on in response to the previous scan signal Sn−1 at the low level, the initialization voltage Vint is connected from the initialization voltage line 192 to the gate electrode G1 of the driving transistor T1 through the initialization transistor T4, and the driving transistor T1 is initialized by the initialization voltage Vint.

Thereafter, the scan signal Sn having the low level is supplied through the scan line 121 during a data programming period. Then, the switching transistor T2 and the compensation transistor T3 are turned on in response to the scan signal Sn at the low level. In this case, the driving transistor T1 is diode-connected by the turned-on compensation transistor T3 and biased in a forward direction.

A compensation voltage Dm+Vth (Vth has a negative (−) value) reduced from the data signal Dm supplied from the data line 171 by a threshold voltage Vth of the driving transistor T1 is then applied to the gate electrode G1 of the driving transistor T1. The driving voltage ELVDD and the compensation voltage Dm+Vth are applied to both ends of the storage capacitor Cst, and a charge corresponding to a voltage difference between both ends is stored in the storage capacitor Cst.

Thereafter, for the emission period, the light emission control signal EM supplied from the light emission control line 123 is changed from the high level to the low level. Subsequently, for the emission period, the operation control transistor T5 and the light emission control transistor T6 are turned on by the light emission control signal EM at the low level.

Then, a driving current Id is generated according to a voltage difference between the gate voltage of the gate electrode G1 of the driving transistor T1 and the driving voltage ELVDD, and the driving current Id is supplied to the organic light emitting diode OLED through the light emission control transistor T6. For a light emission period, a gate-source voltage Vgs of the driving transistor T1 is maintained at '(Dm+Vth)−ELVDD' by the storage capacitor Cst, and according to a current-voltage relationship of the driving transistor T1, the driving current ld is proportional to the square '(Dm−ELVDD)2' of a value obtained by subtracting the threshold voltage from the source-gate voltage. Accordingly, the driving current ld is determined regardless of the threshold voltage Vth of the driving transistor T1.

In this case, the bypass transistor T7 receives the bypass signal BP from the bypass control line 128. The bypass signal BP is a voltage at a predetermined level which may always turn off the bypass transistor T7, the bypass transistor T7 receives a voltage at a transistor off level from the gate electrode G7 and thus the bypass transistor T7 is always turned off, and a part of the driving current ld flows out through the bypass transistor T7 as a bypass current Ibp in the off state.

Even in the case where a minimum current of the driving transistor T1 displaying a black image flows as the driving current, when the organic light emitting diode OLED emits light, the black image is not displayed well. Accordingly, the bypass transistor T7 of the organic light emitting diode display device according to the exemplary embodiment may distribute a part of the minimum current of the driving transistor T1 as the bypass current Ibp to a current path other than the current path of the organic light emitting diode side. Herein, the minimum current of the driving transistor T1 means a current under a condition in which the driving transistor T1 is turned off because the gate-source voltage Vgs of the driving transistor T1 is smaller than the threshold voltage Vth. The minimum driving current (for example, a current of 10 pA or less) under the condition in which the driving transistor T1 is turned off is transferred to the organic light emitting diode OLED to be expressed as an image with black luminance. When the minimum driving current expressing the black image flows, an influence on a bypass transfer of the bypass current Ibp is large, but when a large driving current expressing an image such as a normal image or a white image flows, there may be little influence on the bypass current Ibp. Accordingly, when the driving current displaying a black image flows, the light emission current Ioled of the organic light emitting diode OLED which is reduced by the current amount of the bypass current Ibp which flows out from the driving current Id through the bypass transistor T7 has a minimum current amount as a level which may exactly express the black image. Therefore, a black luminance image is exactly implemented by using the bypass transistor T7, thereby improving a contrast ratio.

In FIG. 2, the bypass signal BP is illustrated to be the same as a next scan signal Sn+1, but is not necessarily limited thereto. In the present exemplary embodiment, the structure including seven transistors (including the bypass transistor T7) and one capacitor is illustrated. However, the numbers of the transistors and the capacitors may be varied without being limited thereto.

A detailed structure of an organic light emitting diode display device shown in FIG. 1 will be described with reference to FIG. 1 and FIG. 3 to FIG. 8.

Figure 3:
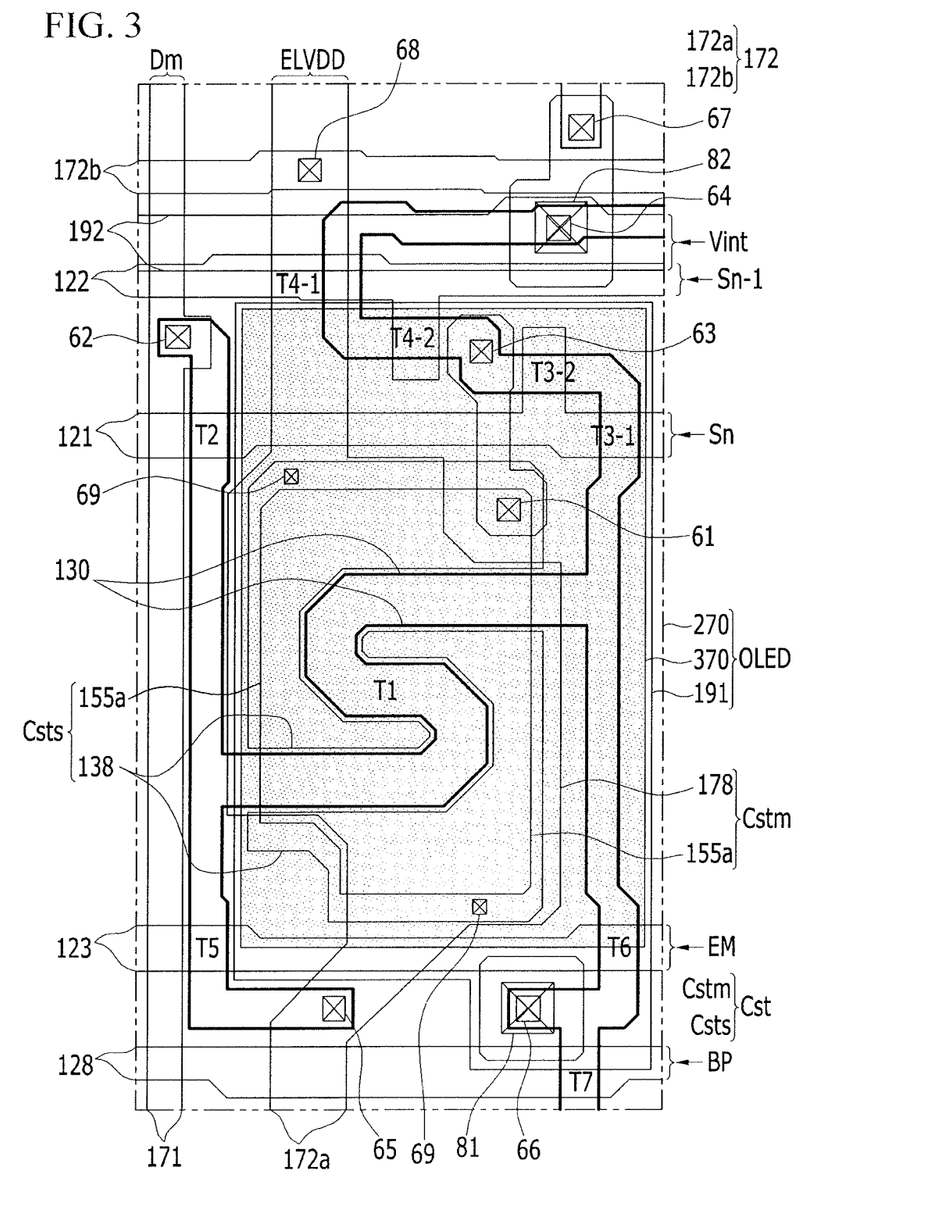
FIG. 3 illustrates a schematic view of a plurality of transistors and capacitors of an organic light emitting diode display device according to an exemplary embodiment.
Figure 4:
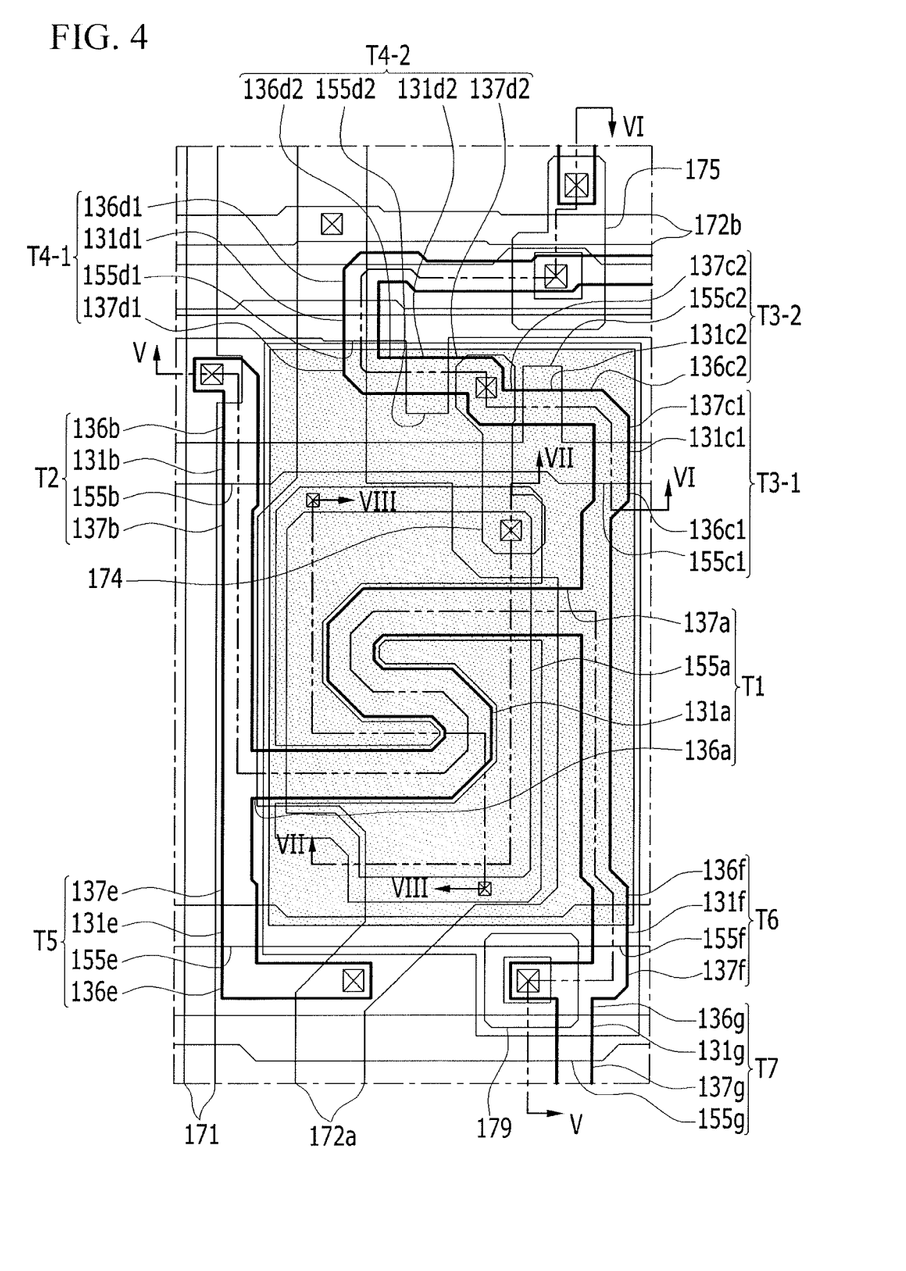
FIG. 4 illustrates a detailed layout view of FIG. 3.
Figure 5:
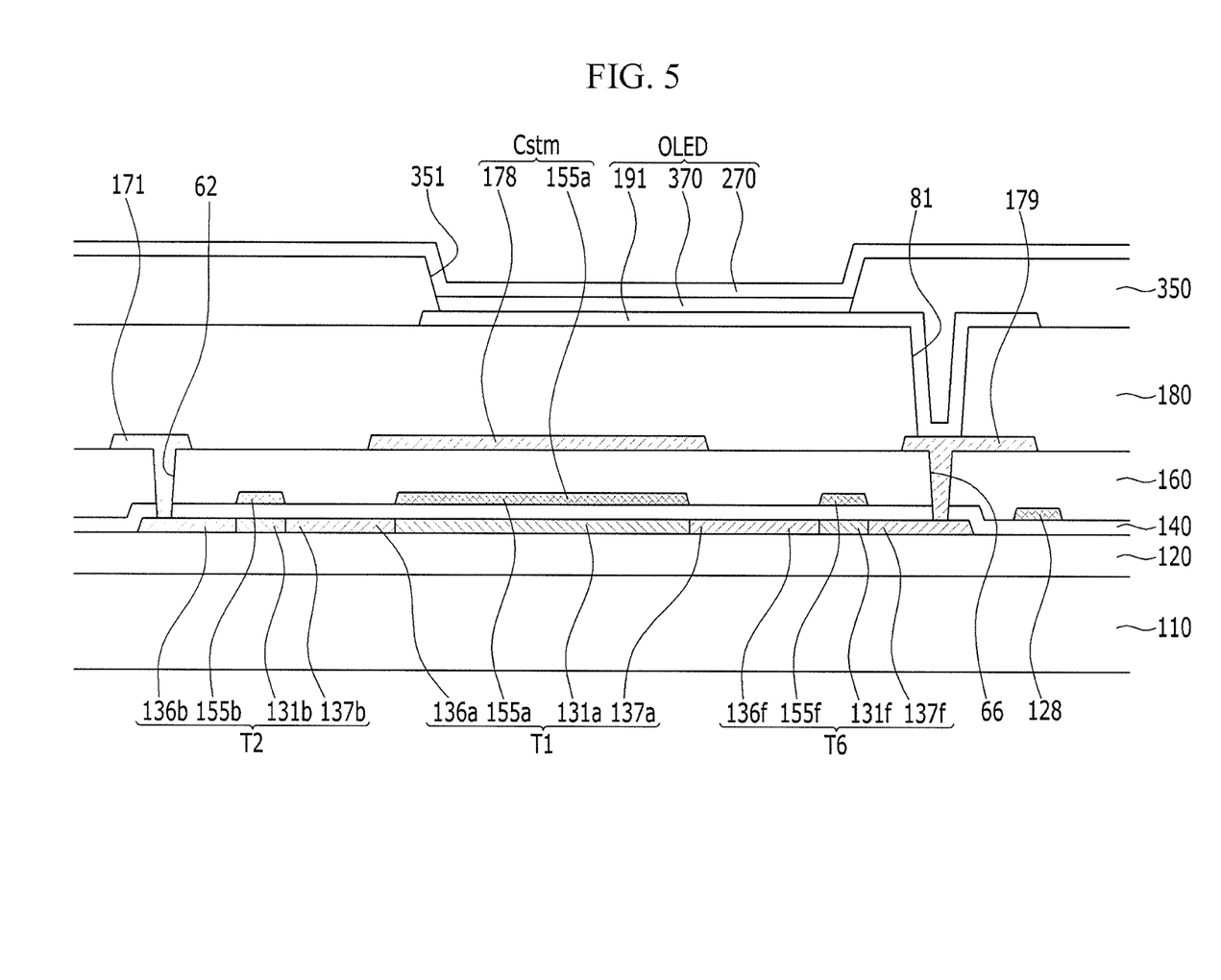
FIG. 5 illustrates a cross-sectional view of the organic light emitting diode display device of FIG. 4 taken along line V-V.
Figure 6:
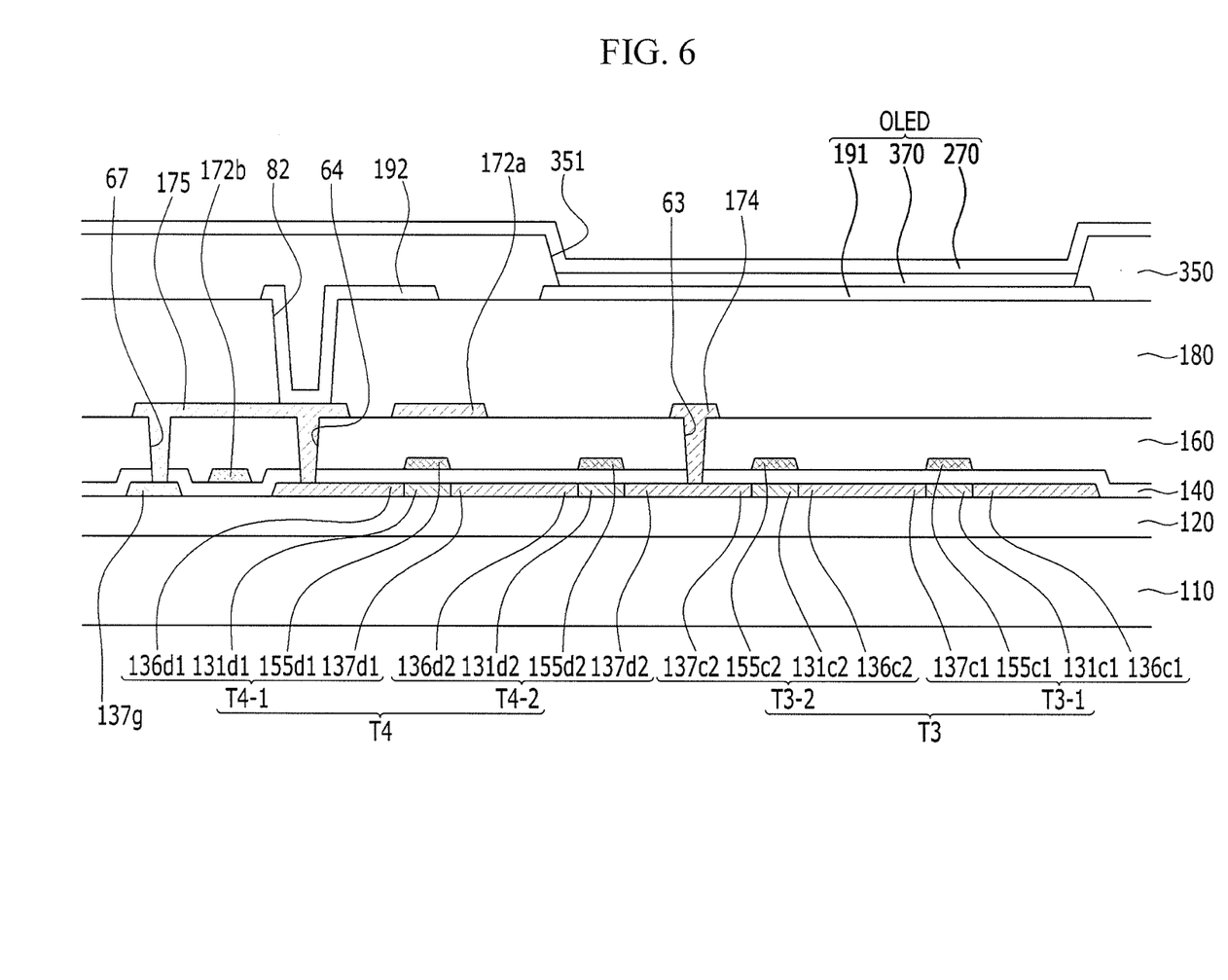
FIG. 6 illustrates a cross-sectional view of the organic light emitting diode display device of FIG. 4 taken along line VI-VI.
Figure 7:
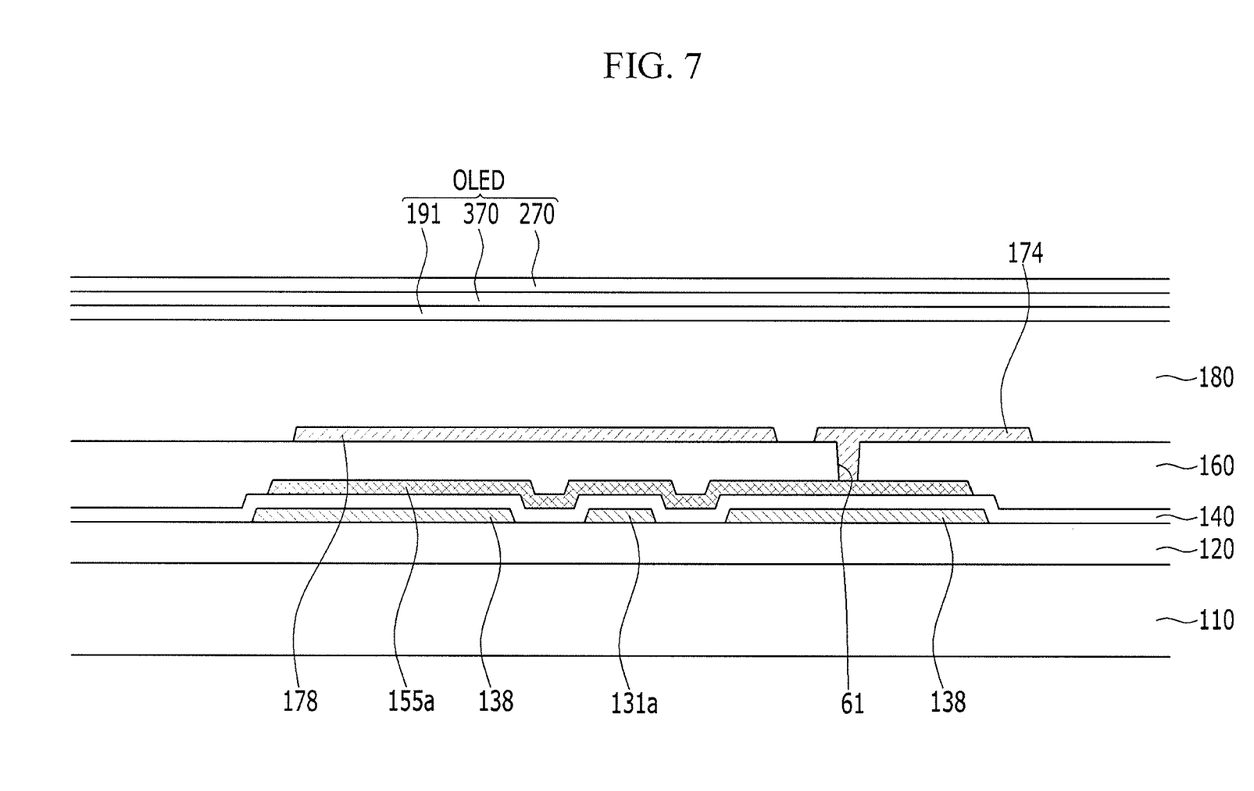
FIG. 7 illustrates a cross-sectional view of the organic light emitting diode display device of FIG. 4 taken along line VII-VII.
Figure 8:
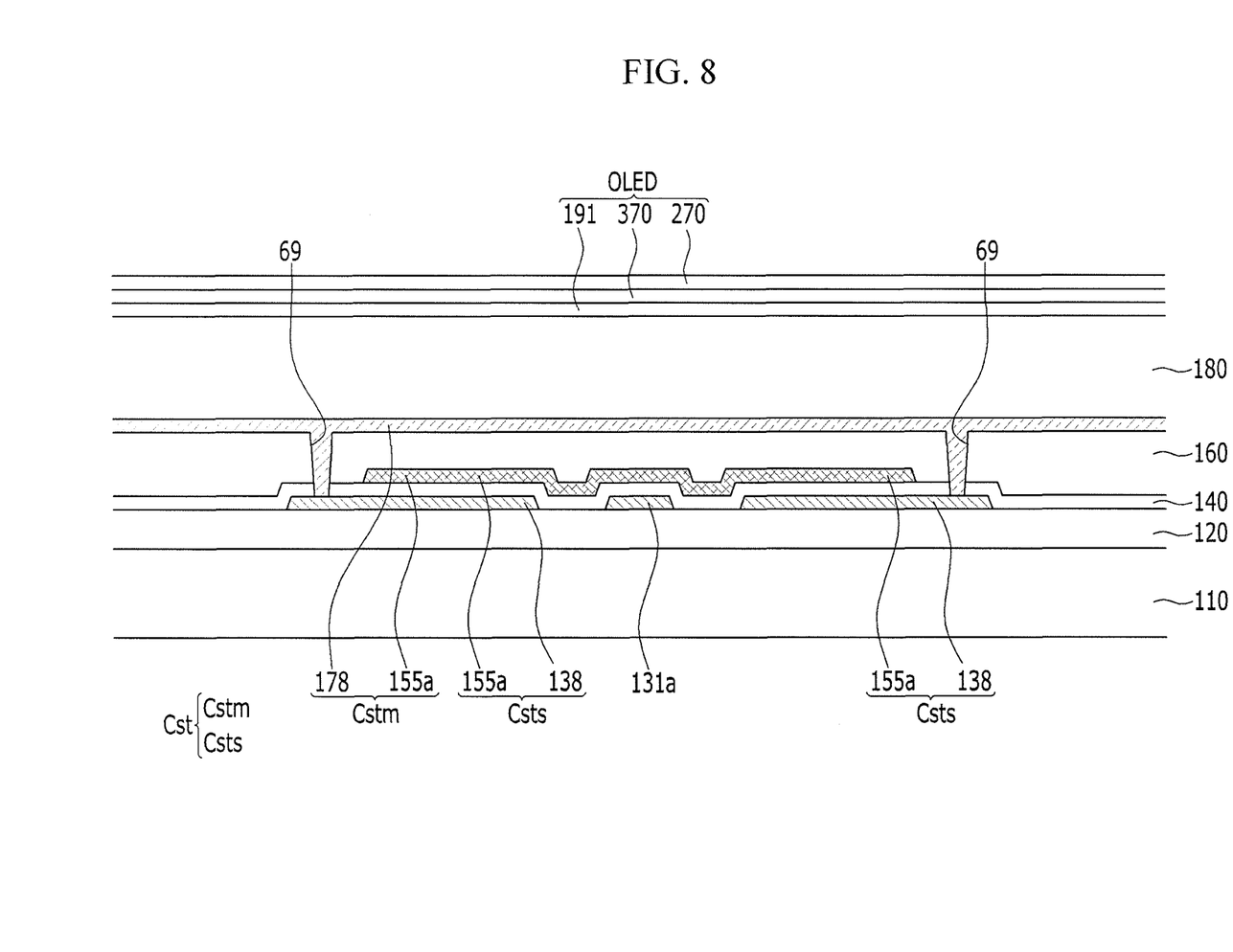
FIG. 8 illustrates a cross-sectional view of the organic light emitting diode display device of FIG. 4 taken along line VIII-VIII.

FIG. 3 is a schematic view of a plurality of transistors and capacitors of an organic light emitting diode display device according to an exemplary embodiment, FIG. 4 is a detailed layout view of FIG. 3, FIG. 5 is a cross-sectional view of the organic light emitting diode display device of FIG. 4 taken along line V-V, FIG. 6 is a cross-sectional view of the organic light emitting diode display device of FIG. 4 taken along line VI-VI, FIG. 7 is a cross-sectional view of the organic light emitting diode display device of FIG. 4 taken along line VII-VII, and FIG. 8 is a cross-sectional view of the organic light emitting diode display device of FIG. 4 taken along line VIII-VIII.

Hereinafter, a detailed planar structure of the organic light emitting diode display device according to the exemplary embodiment will be first described in detail with reference to FIG. 3 and FIG. 4. A detailed cross-sectional structure will be described in detail with reference to FIG. 5 to FIG. 8.

Referring to FIG. 3, the organic light emitting diode display device according to the present exemplary embodiment applies the scan signal Sn, the previous scan signal Sn−1, the light emission control signal EM, and the bypass signal BP, and includes the scan line 121 formed in a row direction, the previous scan line 122, the light emission control line 123, and the bypass control line 128. Further, the organic light emitting diode display device according to the present exemplary embodiment includes the data line 171 and the driving voltage line 172 which are disclosed to cross the scan line 121, the previous scan line 122, the light emission control line 123, and the bypass control line 128, and apply the data signal Dm and the driving voltage ELVDD to the pixel, respectively.

The initialization voltage Vint is transferred to the compensation transistor T3 through the initialization voltage line 192. The driving voltage line 172 is formed to include a vertical driving voltage line 172a which is parallel with the data line 171, and a horizontal driving voltage line 172b which is parallel with the scan line 121. The vertical driving voltage line 172a is electrically connected to the horizontal driving voltage line 172b through a contact hole 68.

Further, in the pixel, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED including a pixel electrode 191, an organic emission layer 370, and a common electrode 270 are disposed. In this case, the compensation transistor T3 and the initialization transistor T4 are configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 are formed in one semiconductor 130 to be connected, and the semiconductor 130 may be formed to be curved in various shapes. The semiconductor 130 may be made of a polycrystalline semiconductor material or an oxide semiconductor material. The oxide semiconductor material may include, e.g., any one of oxides based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide ($InGaZnO_4$), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. In the case where the semiconductor 130 is made of the oxide semiconductor material, a separate passivation layer for protecting the oxide semiconductor material which is vulnerable to an external environment, e.g., high temperature, may be added.

The semiconductor 130 includes a channel which is channel-doped with an N-type impurity or a P-type impurity, and a source doping part and a drain doping part which are formed at both sides of the channel and doped with an opposite-type doping impurity to the doping impurity doped on the channel. In the present exemplary embodiment, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors is doped and thus the source electrode and the drain electrode may be electrically connected to each other.

As illustrated in FIG. 4, the channel includes a driving channel 131a formed in the drive transistor T1, a switching channel 131b formed in the switching transistor T2, first and second compensation channels 131c1 and 131c2 formed in the compensation transistor T3, first and second initialization channels 131d1 and 131d2 formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be formed to be elongated in a narrow space. Accordingly, a driving range of the gate voltage applied to the driving gate electrode 155a is increased by the elongated driving channel 131a. Since the driving range of the gate voltage is increased, a gray scale of light emitted from the organic light emitting diode OLED may be finely controlled by changing the magnitude of the gate voltage, and as a result, the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a is overlapped with the driving channel 131a, and the driving source electrode 136a and the driving drain electrode 137a do not overlap the driving channel 131a.

The switching transistor T2 includes the switching channel 131b, a switching gate electrode 155b, a switching source electrode 136b, and a switching drain electrode 137b. The switching gate electrode 155b which is a part extended downward from the scan line 121 overlaps the switching channel 131b, and the switching source electrode 136b and the switching drain electrode 137b do not overlap the switching channel 131b. The switching source electrode 136b is connected with the data line 171 through a contact hole 62.

The compensation transistor T3 is formed to include two compensation transistors in order to prevent the leakage current, and specifically includes a first compensation transistor T3-1 and a second compensation transistor T3-2 which are adjacent to each other. The first compensation transistor T3-1 is disposed around the scan line 121, and the second compensation transistor T3-2 is positioned around a projection of the scan line 121. The first compensation transistor T3-1 includes the first compensation channel 131c1, a first compensation gate electrode 155c1, a first compensation source electrode 136c1, and a first compensation drain electrode 137c1, and the second compensation transistor T3-2 includes the second compensation channel 131c2, a second compensation gate electrode 155c2, a second compensation source electrode 136c2, and a second compensation drain electrode 137c2.

The first compensation gate electrode 155c1 which is a part of the scan line 121 overlaps the first compensation channel 131c1, and the first compensation source electrode 136c1 and the first compensation drain electrode 137c1 do not overlap the first compensation channel 131c1. The first compensation source electrode 136c1 is connected with a light emission control source electrode 136f and the driving drain electrode 137a, and the first compensation drain electrode 137c1 is connected with the second compensation source electrode 136c2.

The second compensation gate electrode 155c2 which is a projection protruding upward from the scan line 121 overlaps the second compensation channel 131c2, and the second compensation source electrode 136c2 and the second compensation drain electrode 137c2 do not overlap the second compensation channel 131c2. The second compensation drain electrode 137c2 is connected with a first data connection member 174 through a contact hole 63.

The initialization transistor T4 is formed to include two initialization transistors in order to prevent the leakage current, and specifically includes a first initialization transistor T4-1 and a second initialization transistor T4-2 which are adjacent to each other. The first initialization transistor T4-1 is disposed around the previous scan line 122, and the second initialization transistor T4-2 is disposed around a projection of the previous scan line 122. The first initialization transistor T4-1 includes the first initialization channel 131d1, a first initialization gate electrode 155d1, a first initialization source electrode 136d1, and a first initialization drain electrode 137d1, and the second initialization transistor T4-2 includes the second initialization channel 131d2, a second initialization gate electrode 155d2, a second initialization source electrode 136d2, and a second initialization drain electrode 137d2.

The first initialization gate electrode 155d1 which is a part of the previous scan line 122 overlaps the first initialization channel 131d1, and the first initialization source electrode 136d1 and the first initialization drain electrode 137d1 do not overlap the first initialization channel 131d1. The first initialization source electrode 136d1 is connected with a second data connection member 175 through a contact hole 64, and the first initialization drain electrode 137d1 is connected with the second initialization source electrode 136d2.

The second initialization gate electrode 155d2 which is a projection protruding downward from the previous scan line 122 overlaps with the second initialization channel 131d2, and the second initialization source electrode 136d2 and the second initialization drain electrode 137d2 do not overlap with the second initialization channel 131c2. The second initialization drain electrode 137d2 is connected with the first data connection member 174 through the contact hole 63.

As such, the compensation transistor T3 includes the first compensation transistor T3-1 and the second compensation transistor T3-2, the initialization transistor T4 includes the first initialization transistor T4-1 and the second initialization transistor T4-2, and as a result, it is possible to efficiently prevent the leakage current from being generated by blocking a electron moving path of the semiconductor 130 in the off state.

The operation control transistor T5 includes the operation control channel 131e, an operation control gate electrode 155e, an operation control source electrode 136e, and an operation control drain electrode 137e. The operation control gate electrode 155e which is a part of the light emission control line 123 overlaps the operation control channel 131e, and does not overlap the operation control source electrode 136e and the operation control drain electrode 137e. The operation control source electrode 136e is connected with a part of the driving voltage line 172 through a contact hole 65.

The light emission control transistor T6 includes the light emission control channel 131f, a light emission control gate electrode 155f, the light emission control source electrode 136f, and a light emission control drain electrode 137f. The light emission control gate electrode 155f which is a part of the light emission control line 123 overlaps the light emission control channel 131f, and does not overlap the light emission control source electrode 136f and the light emission control drain electrode 137f. The light emission control drain electrode 137f is connected with a third data connection member 179 through a contact hole 66.

The bypass transistor T7 includes the bypass channel 131g, a bypass gate electrode 155g, a bypass source electrode 136g, and a bypass drain electrode 137g. The bypass gate electrode 155g which is a part of the bypass control line 128 overlaps the bypass channel 131g and does not overlap the bypass source electrode 136g and the bypass drain electrode 137g. The bypass source electrode 136g is directly connected with the light emission control drain electrode 137f, and the bypass drain electrode 137g is connected with a second data connection member 175 through a contact hole 82.

One end of the driving channel 131a of the driving transistor T1 is connected with the switching drain electrode 137b and the operation control drain electrode 137e, and the other end of the driving channel 131a is connected with the compensation source electrode 136c and the light emission control source electrode 136f.

The storage capacitor Cst includes a main storage capacitor Cstm and an auxiliary storage capacitor Csts.

The main storage capacitor Cstm includes the driving gate electrode 155a and a main storage electrode 178 between which a second insulating layer 160 is disposed (see FIG. 8). The auxiliary storage capacitor Csts includes the driving gate electrode 155a and an auxiliary storage electrode 138 between which a first insulating layer 140 is disposed (see FIG. 8). For example, as illustrated in FIG. 8, the main storage capacitor Cstm may be above, e.g., may overlap, the auxiliary storage capacitor Csts.

The main storage electrode 178 is an expanded portion of the vertical driving voltage line 172a. The auxiliary storage electrode 138 is formed by using the same material as that of the semiconductor 130, and is separated from the semiconductor 130. Further, the auxiliary storage electrode 138 is electrically connected with the main storage electrode 178 through a contact hole 69. One driving gate electrode 155a, one main storage electrode 178, and one auxiliary storage electrode 138 are formed for every pixel.

In the case of the main storage capacitor Cstm, the second insulating layer 160 serves as a dielectric material, and storage capacitance is determined according to a charge accumulated in the storage capacitor Cst and a voltage between the driving gate electrode 155a and the main storage electrode 178. In the auxiliary storage capacitor Csts, the first insulating layer 140 serves as a dielectric material, and storage capacitance is determined according to a charge accumulated in the storage capacitor Cst and a voltage between the driving gate electrode 155a and the auxiliary storage electrode 138.

As such, it is possible to obtain a space for forming the storage capacitor Cst even when the space is narrowed by the driving channel 131a that largely occupies the pixel by using the driving gate electrode 155a as a storage electrode for forming the storage capacitor Cst.

Further, the storage capacitor Cst includes the driving gate electrode 155a and the auxiliary storage capacitor Csts, by using the auxiliary storage electrode 138 formed of the same material as that of the semiconductor 130, in addition to the main storage capacitor Cstm, thereby increasing the magnitude of the storage capacitor Cst. As a result, it is possible to reduce areas of the driving gate electrode 155a and the main storage electrode 178 forming the main storage capacitor Cst. Accordingly, it is possible to improve a resolution of the organic light emitting diode display device.

The driving gate electrode 155a is connected with the first data connecting member 174 through a contact hole 61. The first data connection member 174 is formed on the same layer as the data line 171 to be substantially parallel thereto, and serves to connect the driving gate electrode 155a, the second compensation drain electrode 137c2 of the second compensation transistor T3-2, and the second initialization drain electrode 137d2 of the second initialization transistor T4-2.

As a result, the storage capacitor Cst stores storage capacitance corresponding to a difference between the gate voltage of the driving gate electrode 155a and the driving voltage ELVDD transferred to the main storage electrode 178 and the auxiliary storage electrode 138 through the vertical driving voltage line 172a.

Hereinafter, cross-sectional structures of the pixel unit and the peripheral unit in an organic light emitting diode display device according to an exemplary embodiment will be described in detail according to a stacking order with reference to FIG. 5, FIG. 6, FIG. 7, and FIG. 8. In this case, since stacked structures of the operation control transistor T5 and the bypass transistor T7 are mostly the same as that of the light emission control transistor T6, a detailed description thereof will be omitted.

Referring to FIGS. 5-8, a buffer layer 120 may be formed on an insulating substrate 110. The insulating substrate 110 may be formed of an insulating material, e.g., glass, crystal, ceramic, or plastic. The buffer layer 120 blocks impurities from the insulating substrate 110 during a crystallization process for forming a polycrystalline semiconductor to serve to improve characteristics of the polycrystalline semiconductor and reduce stress applied to the insulating substrate 110

The semiconductor 130 including the driving channel 131a, the switching channel 131b, the first compensation channel 131c1, the second compensation channel 131c2, the first initialization channel 131d1, the second initialization channel 131d2, and the light emission control channel 131f is disposed on the buffer layer 120. Further, the semiconductor 130 further includes the operation control channel 131e and the bypass channel 131g (see FIG. 4). In addition, as illustrated in FIGS. 7-8, the auxiliary storage electrode 138 formed of the same material as that of the semiconductor 130 is disposed on the buffer layer 120, e.g., both the auxiliary storage electrode 138 and the semiconductor 130 may be formed directly on the buffer layer 120 of the same material and to a same thickness.

In the semiconductor 130, the driving source electrode 136a and the driving drain electrode 137a are respectively formed at opposite sides of the driving channel 131a, and the switching source electrode 136b and the switching drain electrode 137b are respectively formed at opposite sides of the switching channel 131b. Similarly, in the semiconductor 130, the first compensation source electrode 136c1 and the first compensation drain electrode 137c1 are respectively formed at opposite sides of the first compensation channel 131c1, and the second compensation source electrode 136c2 and the second compensation drain electrode 137c2 are respectively formed at opposite sides of the second compensation channel 131c2. Further, in the semiconductor 130, the first initialization source electrode 136d1 and first initialization drain electrode 137d1 are respectively formed at opposite sides of the first initialization channel 131d1, and the second initialization source electrode 136d2 and second initialization drain electrode 137d2 are respectively formed at opposite sides of the second initialization channel 131d2. Further, in the semiconductor 130, the light emission control source electrode 136f and the light emission control drain electrode 137f are respectively formed at opposite sides of the light emission control channel 131f. In addition, in the semiconductor 130, the operation control source electrode 136e and the operation control drain electrode 137e are respectively formed at opposite sides of the operation control channel 131e, and the bypass source electrode 136g and the bypass drain electrode 137g are respectively formed at opposite sides of the bypass channel 131g (see FIG. 4).

The auxiliary storage electrode 138 is separated from the semiconductor 130, and is disposed at opposite sides of the driving channel 131a. As such, since the auxiliary storage electrode 138 is formed on the same layer by using the same material as that of the semiconductor 130, i.e., without forming an auxiliary storage electrode on a different layer by using a different material, it is possible to reduce the number of masks that are used for manufacturing the organic light emitting diode display device.

The first insulating layer 140 is disposed to cover the semiconductor 130 and the auxiliary storage electrode 138. The gate wires 121, 122, 123, 128, 155a, and 172b including the scan line 121 with the switching gate electrode 155b, the first compensation gate electrode 155c1, and the second compensation gate electrode 155c2, the previous scan line 122 with the first initialization gate electrode 155d1 and the second initialization gate electrode 155d2, the light emission control line 123 with the operation control gate electrode 155e and the light emission control gate electrode 155f, the bypass control line 128 with the bypass gate electrode 155g, the driving gate electrode (storage electrode) 155a, and the horizontal driving voltage line 172b are disposed on the first insulating layer 140.

The second insulating layer 160 is disposed to cover the gate wires 121, 122, 123, 128, 155a, and 172b, and the first insulating layer 140. Each of the first insulating layer 140 and the second insulating layer 160 may be formed of an insulating material, e.g., silicon nitride (SiN$_x$) or silicon oxide (SiO$_x$).

The data wires 171, 172a, 174, 175, 178, and 179 including the data line 171, the vertical driving voltage line 172a, the main storage electrode 178, the first data connecting member 174, the second data connecting member 175, and the third data connecting member 179 are disposed on, e.g., directly on, the second insulating layer 160. As such, since the main storage electrode 178 is formed directly on the same layer by using the same material as those of the vertical driving voltage line 172a and the data line 171, i.e., without t forming the main storage electrode 178 on a different layer by using a different metal, it is possible to reduce the number of masks that are used for manufacturing the organic light emitting diode display device.

The data line 171 is connected with the switching source electrode 136b through the contact hole 62 formed in the first insulating layer 140 and the second insulating layer 160, one end of the first data connecting member 174 is connected with the driving gate electrode 155a through the contact hole 61 formed at the first insulating layer 140 and the second insulating layer 160, and the other end of the first data connecting member 174 is connected with the second compensation drain electrode 137c2 and the second initialization drain electrode 137d2 through the contact hole 63 formed at the first insulating layer 140 and the second insulating layer 160.

The second data connecting member 175 is connected with the first initialization source electrode 136d1 through the contact hole 64 formed at the first insulating layer 140 and the second insulating layer 160, and is connected with the bypass drain electrode 137g through a contact hole 67 formed at the first insulating layer 140 and the second insulating layer 160. It is possible to prevent transistors from being formed around the horizontal driving voltage line 172b by indirectly connecting the bypass drain electrode 137g and the first initialization source electrode 136d1 with each other through the second data connecting member 175 without directly connecting them. Further, the quadrangular-shaped third data connecting member 179 is connected with the light emission control drain electrode 137f through the contact hole 66 formed at the first insulating layer 140 and the second insulating layer 160.

The main storage electrode 178 is connected with the auxiliary storage electrode 138 through the contact hole 69 formed at the first insulating layer 140 and the second insulating layer 160 (FIG. 8). As a result, the same voltage is applied to the main storage electrode 178 and the auxiliary storage electrode 138. In this case, the contact hole 69 is disposed at opposite ends of the driving channel 131a.

A passivation layer 180 is disposed to cover the data wires 171, 172a, 174, 175, 178, and 179, and the second insulating layer 160. The passivation layer 180 may be formed of an inorganic film.

The pixel electrode 191 and the initialization line 192 are disposed on the passivation layer 180 (FIG. 6). The third data connecting member 179 is connected with the pixel electrode 191 through a contact hole 81 formed at the passivation layer 180 (FIG. 5), and the second data connecting member 175 is connected with the initialization line 192 through the contact hole 82 formed at the passivation layer 180 (FIG. 6). The pixel electrode 191 and the initialization line 192 may be formed of the same material.

A pixel definition layer (PDL) 350 covering the passivation layer 180, the initialization voltage line 192, and the pixel electrode 191 is formed on edges of the passivation layer 180, the initialization voltage line 192, and the pixel electrode 191, and the pixel definition layer 350 has a pixel opening 351 that exposes the pixel electrode 191 (FIGS. 5-6). The pixel definition layer 350 may be made of, e.g., a polyacrylate resin, a polyimide resin, or a silica-based inorganic material.

The organic emission layer 370 is disposed on the pixel electrode 191 exposed by the pixel opening 351, and the common electrode 270 is formed on the organic emission layer 370. Accordingly, the organic light emitting diode OLED including the pixel electrode 191, the organic emission layer 370, and the common electrode 270 is formed.

Herein, the pixel electrode 191 serves as an anode which is a hole injection electrode, and the common electrode 270 serves as a cathode which is an electron injection electrode. However, the present exemplary embodiment is not limited thereto. Alternatively, according to the driving method of the organic light emitting diode display device, the pixel electrode 191 may serve as the cathode and the common electrode 270 may serve as the anode. When holes and electrons are injected into the organic emission layer 370 from the pixel electrode 191 and the common electrode 270, respectively, and excitons acquired by combining the injected holes and electrons fall from an excitation state to a ground state, light is emitted.

The organic emission layer 370 is made of a low-molecular organic material or a high-molecular organic material, e.g., poly(3,4-ethylenedioxythiophene) (PEDOT). Further, the organic emission layer 370 may be formed by multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode, and the hole transporting layer, the emission layer, the electron transporting layer, and the electron injection layer are sequentially stacked thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are stacked together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

The white organic emission layer described in another example may be formed by one organic emission layer and include a configuration that may emit white light by laminating a plurality of organic emission layers. As an example, the white organic emission layer may include a configuration that enables the white light to be emitted by combining at least one yellow organic emission layer and at least one blue organic emission layer, combining at least one cyan organic emission layer and at least one red organic emission layer, combining at least one magenta organic emission layer and at least one green organic emission layer, and the like.

A sealing member (not shown) protecting the organic light emitting diode OLED may be disposed on the common electrode 270, and may be sealed on the substrate 110 by using a sealant and may be made of various materials such as glass, crystal, ceramic, plastic, and metal. Alternatively, instead of using the sealant, a thin film sealing layer may be formed by depositing an inorganic film and an organic film on the common electrode 270.

Exemplary embodiments provide an organic light emitting diode display device with reduced areas of capacitor electrodes. That is, exemplary embodiments provide a storage capacitor that includes a main storage capacitor and an auxiliary storage capacitor, so areas of the driving gate electrode and the main storage electrode, which form the main storage capacitor, may be reduced. Accordingly, it is possible to improve resolution of the organic light emitting diode display device.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light emitting diode display device, comprising:
    an insulation substrate;
    a semiconductor on the insulation substrate, the semiconductor including a driving channel having at least one portion;
    an auxiliary storage electrode on the insulation substrate, the auxiliary storage electrode being formed of a same material as that of the semiconductor and being separated from the semiconductor;
    a first insulating layer covering the semiconductor and the auxiliary storage electrode;
    a gate wire on the first insulating layer, the gate wire including a driving gate electrode overlapping the driving channel of the semiconductor and the auxiliary storage electrode, the auxiliary storage electrode with the driving gate electrode defining an auxiliary storage capacitor;
    a second insulating layer covering the gate wire and the first insulating layer;
    a data wire on the second insulating layer, the data wire including a vertical driving voltage line and a main storage electrode, and the main storage electrode overlapping the driving gate electrode of the gate wire to define a main storage capacitor;
    a passivation layer covering the data wire and the second insulating layer;
    a pixel electrode on the passivation layer;
    an organic emission layer on the pixel electrode; and
    a common electrode disposed on the organic emission layer.

2. The organic light emitting diode display device as claimed in claim 1, wherein the auxiliary storage electrode and the main storage electrode are electrically connected to each other through a contact hole in the first insulating layer and the second insulating layer.

3. The organic light emitting diode display device as claimed in claim 2, wherein the auxiliary storage electrode is at opposite sides of the driving channel.

4. The organic light emitting diode display device as claimed in claim 3, wherein the main storage electrode extends from the vertical driving voltage line.

5. The organic light emitting diode display device as claimed in claim 1, wherein:
    the semiconductor further includes a switching channel, a first compensation channel, a second compensation channel, a first initialization channel, a second initialization channel, an operation control channel, a light emission control channel, and a bypass channel, and
    the switching channel, the first compensation channel, the second compensation channel, the first initialization channel, the second initialization channel, the operation control channel, the light emission control channel, and the bypass channel are integral with the driving channel.

6. The organic light emitting diode display device as claimed in claim 5, wherein the semiconductor further includes:

a driving source electrode and a driving drain electrode respectively disposed at opposite sides of the driving channel;

a switching source electrode and a switching drain electrode respectively disposed at opposite sides of the switching channel;

a first compensation source electrode and a first compensation drain electrode respectively disposed at opposite sides of the first compensation channel;

a second compensation source electrode and a second compensation drain electrode respectively disposed at opposite sides of the second compensation channel;

a first initialization source electrode and a first initialization drain electrode respectively disposed at opposite sides of the first initialization channel;

a second initialization source electrode and a second initialization drain electrode respectively disposed at opposite sides of the second initialization channel;

an operation control source electrode and an operation control drain electrode respectively disposed at opposite sides of the operation control channel;

a light emission control source electrode and a light emission control drain electrode respectively disposed at opposite sides of the light emission control channel; and a bypass source electrode and a bypass drain electrode respectively disposed at opposite sides of the bypass channel.

7. The organic light emitting diode display device as claimed in claim 6, wherein the gate wire further includes:

a scan line to transfer a scan signal;

a previous scan line to transfer a previous scan signal;

a light emission control line to transfer a light emission control signal;

a bypass control line to transfer a bypass signal; and a horizontal driving voltage line connected to the vertical driving voltage line.

8. The organic light emitting diode display device as claimed in claim 7, wherein the scan line, the previous scan line, the light emission control line, the bypass control line, and the horizontal driving voltage line extend in a same direction.

9. The organic light emitting diode display device as claimed in claim 8, wherein:

the scan line includes a switching gate electrode overlapping the switching channel, a first compensation gate electrode overlapping the first compensation channel, and a second compensation gate electrode overlapping the second compensation channel, the previous scan line includes a first initialization gate electrode overlapping the first initialization channel and a second initialization gate electrode overlapping the second initialization channel, the light emission control line includes an operation control gate electrode overlapping the operation control channel and a light emission control gate electrode overlapping the light emission control channel, and the bypass control line includes a bypass gate electrode overlapping the bypass channel.

10. The organic light emitting diode display device as claimed in claim 9, wherein the data wire includes:

a data line connected to the switching source electrode;

a first data connecting member connected to the driving source electrode, the second compensation drain electrode, and the second initialization drain electrode;

a second data connecting member connected to the first initialization source electrode and the bypass drain electrode; and a third data connecting member connected to the operation control drain electrode and the pixel electrode.

11. The organic light emitting diode display device as claimed in claim 10, wherein the data line crosses the scan line and transfers a data signal, and the vertical driving voltage line extends in a direction that is parallel with the data line and transfers a driving voltage.

12. The organic light emitting diode display device as claimed in claim 11, further comprising an initialization line on the passivation layer and connected to the second data connecting member.

13. The organic light emitting diode display device as claimed in claim 12, wherein the initialization line is formed of a same material as that of the pixel electrode to transfer an initialization voltage.

14. The organic light emitting diode display device as claimed in claim 13, wherein;

the driving source electrode is connected to the switching drain electrode and the operation control drain electrode, and the driving drain electrode is connected to the first compensation source electrode and the light emission control source electrode.

15. The organic light emitting diode display device as claimed in claim 14, wherein the first compensation source electrode is connected to the light emission control source electrode and the driving drain electrode, and the first compensation drain electrode is connected to the second compensation source electrode.

16. The organic light emitting diode display device as claimed in claim 15, wherein the first initialization drain electrode is connected to the second initialization source electrode.

17. The organic light emitting diode display device as claimed in claim 16, wherein the operation control electrode is connected to the vertical driving voltage line.

* * * * *